(12) United States Patent
Taniguchi

(10) Patent No.: US 6,437,662 B1
(45) Date of Patent: Aug. 20, 2002

(54) SURFACE ACOUSTIC WAVE FILTER, DUPLEXER AND COMMUNICATION APPARATUS WITH COMBINED SUBSTRATE AND NUMBER OF FINGER PAIRS REDUCING PASS BAND RIPPLES

(75) Inventor: Norio Taniguchi, Ishikawa-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/629,996

(22) Filed: Aug. 1, 2000

(30) Foreign Application Priority Data

Aug. 11, 1999 (JP) ............................................. 11-227567

(51) Int. Cl.⁷ .............................. H03H 9/64; H03H 9/72
(52) U.S. Cl. ...................... 333/133; 333/193; 333/195; 310/313 B; 310/313 A
(58) Field of Search ................................ 333/193–196; 310/313 R, 313 B, 313 C, 313 D, 313 A (56) References Cited

U.S. PATENT DOCUMENTS

| 5,202,652 A | | 4/1993 | Tabuchi et al. ............. 333/193 |
| 5,726,610 A | * | 3/1998 | Allen et al. ............. 333/193 X |
| 5,796,205 A | | 8/1998 | Nishihara et al. ........ 310/313 R |
| 5,831,493 A | * | 11/1998 | Ushiroku ..................... 333/193 |
| 5,999,069 A | * | 12/1999 | Ushiroku ..................... 333/193 |
| 6,037,847 A | * | 3/2000 | Ueda ........................... 333/193 |

FOREIGN PATENT DOCUMENTS

| JP | 6-29779 | * | 2/1994 | ................. 333/193 |
| JP | 09-167936 | | 6/1997 | |
| JP | 10-242799 | * | 9/1998 | |

* cited by examiner

Primary Examiner—Robert Pascal
Assistant Examiner—Barbara Summons
(74) Attorney, Agent, or Firm—Keating & Bennett, LLP (57) ABSTRACT

A surface acoustic wave filter includes a Y-cut X-propagation $LiTaO_3$ substrate having a cut angle of about 38 degrees to about 46 degrees, at least first and second series arm surface acoustic wave resonators connected in series to define a series arm, and at least one parallel arm surface acoustic wave resonator connected to the series arm. Each of the first and second series arm surface acoustic wave resonators includes an interdigital transducer having a plurality of pairs of electrode fingers, and where a number of pairs of the electrode fingers of the first series arm surface acoustic wave resonator is represented by N (N=natural number), the corresponding number of the second series arm surface acoustic wave resonator differs from n=N (n=natural number).

16 Claims, 13 Drawing Sheets

SURFACE ACOUSTIC WAVE FILTER, DUPLEXER AND COMMUNICATION APPARATUS WITH COMBINED SUBSTRATE AND NUMBER OF FINGER PAIRS REDUCING PASS BAND RIPPLES

BACKGROUND OF THE INVENTION

1. Field of the Invention

The present invention relates to a surface acoustic wave filter for use in a communication apparatus that is used in high frequency bands, and more particularly to a ladder type surface acoustic wave filter.

2. Description of the Related Art

Figure 1:
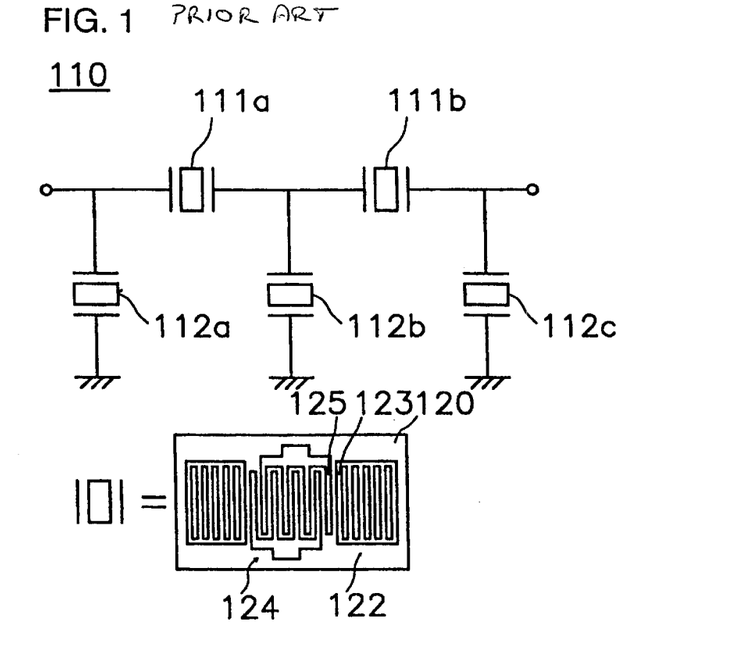
FIG. 1 shows a configuration of an ordinary ladder type surface acoustic wave filter.

Generally, as a surface acoustic wave filter designed to achieve good characteristics such as low loss and wide band characteristics, a ladder type surface acoustic wave filter that has one-port resonators alternately arranged on a series arm and parallel arms is known. FIG. 1 is a schematic view of a ladder type surface acoustic wave filter as described above. In a surface acoustic wave filter 110 shown in FIG. 1, two surface acoustic wave resonators 111a and 111b are connected to define a series arm, and three surface acoustic wave resonators 112a, 112b, and 112c are connected to the series arm to define parallel arms, respectively. Each of these surface acoustic wave resonators 111a, 111b, 112a, 112b, and 112c includes an interdigital transducer 124 having a plurality of electrode fingers 125, and a pair of reflectors 122 having a plurality of electrode fingers 123 which are provided on both sides of the interdigital transducer 124.

In the field of communication apparatuses using the above-described surface acoustic wave filter, high-frequency requirements have been increasing, and development of new surface acoustic wave filters meeting the increased requirements are progressing. For example, Japanese Unexamined Patent Publication No. 9-167936 discloses a 38-to-46-degree Y-cut X-propagation LiTaO$_3$ substrate to meet the high-frequency requirements. Conventionally, as a substrate of the surface acoustic wave filter, a 36-degree Y-cut X-propagation LiTaO$_3$ substrate has conventionally been used because it produces a low propagation loss and has a large electromechanical coupling coefficient.

Although the propagation loss decreases where the thickness of an electrode film defining the interdigital transducers is negligibly small relative to the wavelength of a surface acoustic wave, the 36-degree Y-cut X-propagation LiTaO$_3$ has a problem in that, the propagation loss increases where the thickness of an electrode film is increased. Particularly, as the wavelength of the surface acoustic wave decreases in the high-frequency band, the thickness of the electrode film relative to the wavelength becomes so large that the propagation loss increases. On the other hand, when the influence of bulk waves and the increase in electrode resistance are taken into account, reduction in thickness of the electrode film is not preferable because it causes reduction in the characteristics.

In view of the foregoing problems, Japanese Unexamined Patent Publication No. 9-167936 discloses that even in a case where the thickness of the electrode film is increased in consideration of the influence of bulk waves and the increase in the electrode resistance, the propagation loss can be reduced by use of the 38-to-46-degree Y-cut X-propagation LiTaO$_3$ substrate as a substrate of the surface acoustic wave filter.

Conventionally, as a modulation method for cellular phones, a TDMA (time division multiple method) has been used. Recently, however, a CDMA (code division multiple method) is used to efficiently transmit an increasing amount of information. In ordinary cellular phone systems, the total-system frequency band is divided via channels into smaller bands. In this case, according to the TDMA method, the frequency width per channel is as small as several tens of kilohertz (kHz). However, according to the CDMA method, the frequency width is as large as 1 MHz or more.

Where very small ripples exist in the passbands, the difference in the frequency width per channel according to the aforementioned modulation methods becomes apparent with the difference in influence of the ripples. Specifically, according to the TDMA method, when very small ripples exist in the passbands, deviation in loss does not increase since the per-channel frequency width is relatively small. However, according to the CDMA method, the deviation in loss increases since the per-channel frequency width is relatively large. In the cellular phone system, a large amount of loss makes modulation difficult. With a large amount of the deviation in loss that diffuses the frequency for information, a problem also arises in that the CDMA method itself makes modulation difficult. Therefore, with the CDMA method, very small ripples occurring in the passbands become apparent as a problem while such ripples have not caused a problem in the TDMA method. In particular, the very small ripples are required to be reduced to be less than 0.7 dB.

Nonetheless, in the conventional ladder type surface acoustic wave filter, ripples of more than 0.7 dB have occurred in the passbands because of interference of reflection caused in the interdigital transducers and interference of reflection caused in the reflectors in the series arm surface acoustic wave resonators.

Hereinbelow, a description will be given regarding reasons why the ripples are caused in the passbands. The description will be provided referring to the reflector as an example, but the description can also be applied to the interdigital transducers.

Figure 2:
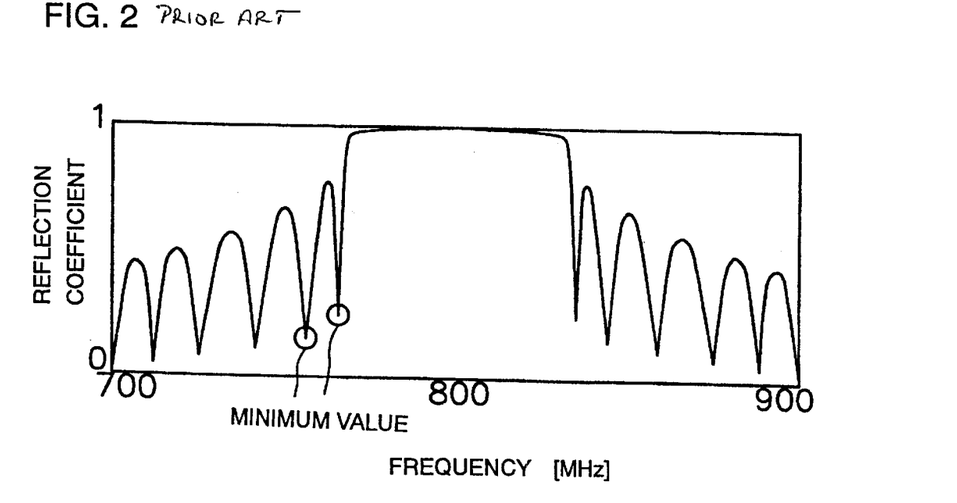
FIG. 2 shows the relationship between reflection coefficients and frequencies in a case where the number of the electrode fingers is 50.
Figure 3:
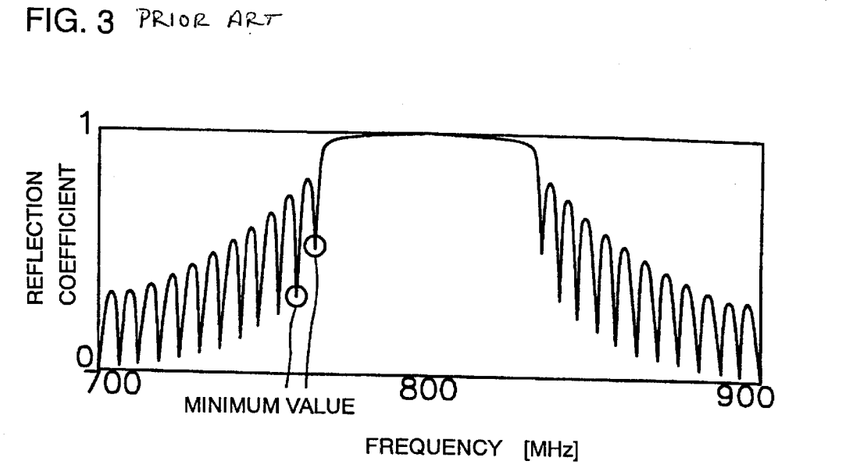
FIG. 3 shows the relationship between reflection coefficients and frequencies in a case where the number of the electrode fingers is 100.

Each of FIGS. 2 and 3 shows frequency characteristics of the reflector. FIG. 2 shows the characteristics where the number of the electrode fingers is 50, while FIG. 3 shows the characteristics where the number of the electrode fingers is 100. In either of the figures, the center frequency is 800 MHz.

Figure 4:
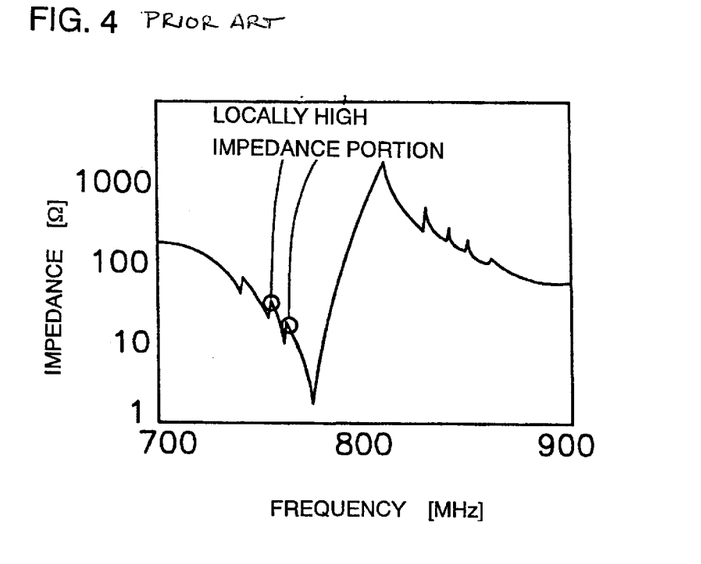
FIG. 4 shows the relationship between impedances and frequencies in a conventional surface acoustic wave filter.
Figure 5:
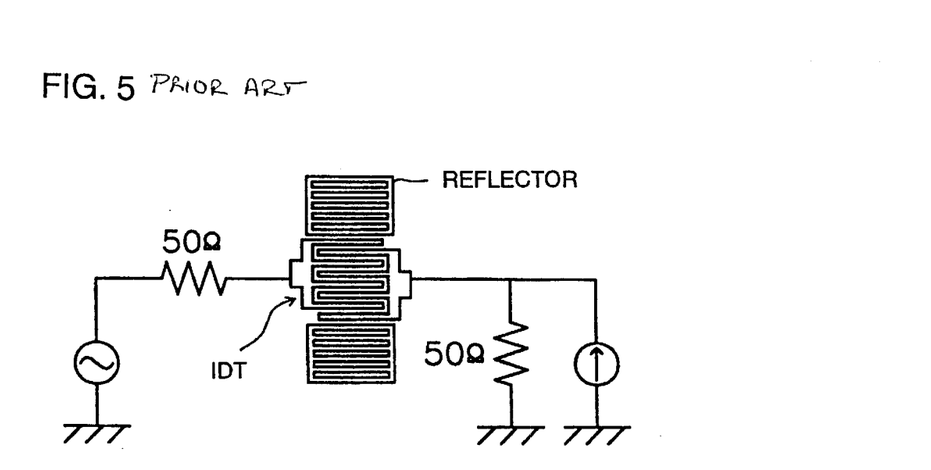
FIG. 5 is a connection view in a case where transmission characteristics are measured by series-connecting the surface acoustic wave resonator.
Figure 6:
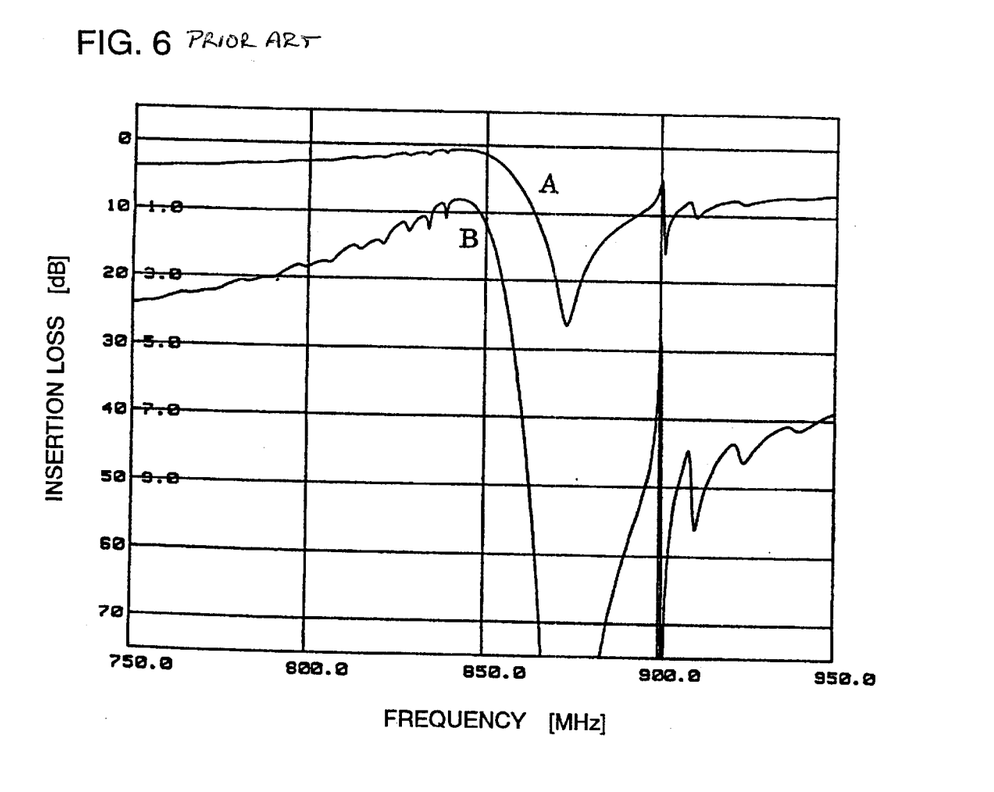
FIG. 6 is a transmission-characteristic view of a surface acoustic wave resonator connected in the manner shown in FIG. 13.

As shown in FIGS. 2 and 3, outside of the stopband, the minimum value to which the reflection coefficient becomes small is repeated. With these minimum values, since excitation efficiency decreases, in view of impedance characteristics of the surface acoustic wave resonator, locally-high-impedance portions occur, as shown in FIG. 4. A surface acoustic wave resonator having the characteristics in which the aforementioned locally-high-impedance portions occur is series-connected as shown in FIG. 5, and transmission characteristics relative to the frequency are measured. As a result, it is known that very small ripples as shown in FIG. 6 occur. In FIG. 6, a graph indicated by B is an enlarged view of a graph indicated by A, and scale points thereof are indicated on the right side of the vertical axis (other characteristic views in this Specification are similarly presented). As shown in FIG. 6, when the ripples occur in the transmission characteristics of the series-connection configuration, ripples also occur in filter characteristics of a surface acoustic wave filter configured using the aforementioned surface acoustic wave resonator. That is, by the influence of the minimum values, ripples occur in filter characteristics of the surface acoustic wave filter.

Hereinbelow, a description will be given of frequencies having the aforementioned minimum values of the reflection coefficients.

Expression 1 shown below can be used to regulate frequencies f having the minimum values of the reflection coefficients by a center frequency $f_0$.

$$f/f_0 = (1 - K_{11}/k_0) \pm \{(K_{12}/k_0)^2 + (n_0/N)^2\}^{1/2}$$

In the above, $K_{11}$ and $K_{12}$ represent, respectively, a self-coupling coefficient (coefficient representing the coupling strength between surface acoustic waves proceeding in the same direction), which is uniquely determined according to factors such as substrate material and electrode-film thickness, and a mutual coupling coefficient (coefficient representing the coupling strength between surface acoustic waves proceeding in directions opposing each other); $k_0$ represents the number of waves in the center frequency; $n_0$ represents an integer larger than 0; and N represents the number of the electrode fingers.

As shown in the expression that expresses the frequency having the minimum value, if the number N of the electrode fingers is infinite, $(n_0/N)^2 = 0$; however, if the number of the electrode fingers is finite, $(n_0/N)^2$ cannot be neglected, and the minimum value exists for each value $n_0$ (integer larger than 0). That is, an innumerable number of the minimum values of reflection coefficients exists outside of the stopband. In addition, since $K_{11}$, $K_{12}$, and $K_0$ are determined to be constants in design, differences in frequency for the minimum values of the reflection coefficients are determined according to the number of the electrode fingers. In this case, the fewer the number N of the electrode fingers, the larger the difference in the frequency. Clearly, from comparison between FIGS. 2 and 3, the differences in the frequency in FIG. 2 showing the case where the number of the electrode fingers is relatively small increase. Also, from comparing FIGS. 2 and 3, the minimum values of the reflection coefficients in FIG. 2 showing the case where the number of the electrode fingers is relatively small are even smaller than those in FIG. 3 which shows the case where the number of the electrode finger is relatively large.

In the surface acoustic wave filter conventionally used, since the number of the electrode fingers is not taken into consideration, the minimum value of the electrode fingers in one of the series arm surface acoustic wave resonators is the same as the minimum value of the reflection coefficient in the other one of the series arm surface acoustic wave resonators. Therefore, the effects of the two resonators are increased by each other, thereby producing larger ripples occurring in the surface acoustic wave filter.

Figure 7:
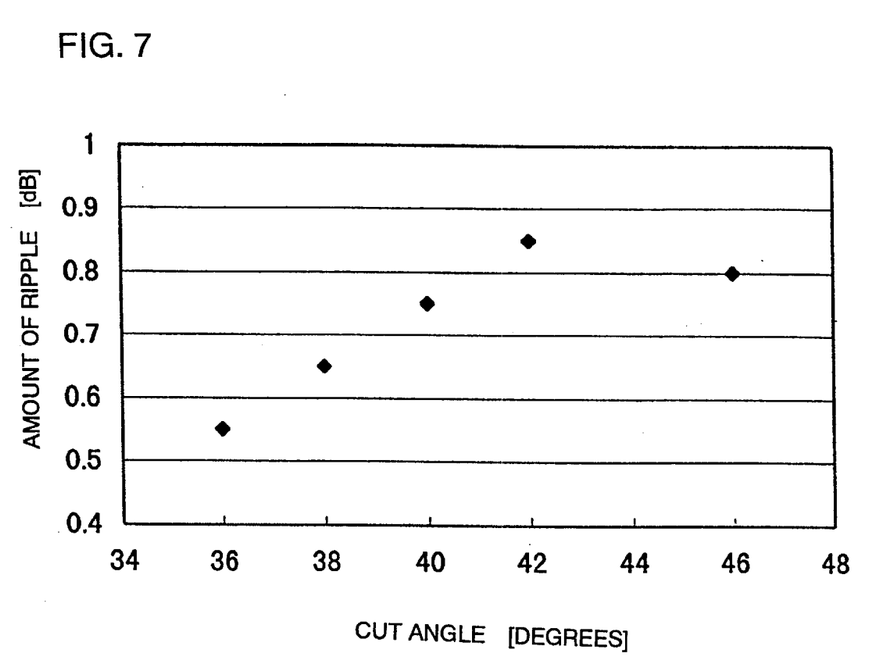
FIG. 7 is a graph showing a relationship between a cut angle and the amount of ripples.

One reason that can be considered for occurrence of the enlarged ripples is that the propagation loss is reduced by use of 38-to-46-degree Y-cut X-propagation LiTaO$_3$ substrate. Specifically, a no-load Q value (a parameter representing sharpness in resonance) increases, thereby increasing sharpness of the ripples occurring because of, for example, the aforementioned interdigital transducers. As shown in FIG. 7, ripples increase when the cut angle is greater than 36 degrees.

SUMMARY OF THE INVENTION

To overcome the problems described above, preferred embodiments of the present invention provide a surface acoustic wave filter, a duplexer, and a communication apparatus, wherein the size of ripples is reduced without reducing the effects of a substrate used for reducing a propagation loss, and therefore, the ripples in the pass bands are smoothed.

According to a preferred embodiment of the present invention, a surface acoustic wave filter includes a Y-cut X-propagation LiTaO$_3$ substrate having a cut angle of about 38 degrees to about 46 degrees, at least two surface acoustic wave resonators on a series arm and at least one surface acoustic wave resonator on a parallel arm, and either the number of pairs of electrode fingers or the number of electrode fingers that configure the surface acoustic wave resonators on the series arm is appropriately set. Specifically, with reference to one of the surface acoustic wave resonators that has either the smallest number of pairs of the electrode fingers or the smallest number of the electrode fingers, either the number of pairs of the electrode fingers or the number of the electrode fingers in at least one of the other surface acoustic wave resonators on the series arm is set so as not to be a positive integer multiple of the number in the former case. As a result, ripples caused by the series arm surface acoustic wave resonator having either the smallest number of pairs of the electrode fingers or the smallest number of the electrode fingers (since either the number of pairs of the electrode fingers or the number of the electrode fingers is smallest, the size of ripples caused thereby is largest) are suppressed and minimized by the series arm surface acoustic wave resonator in which either the number of pairs of the electrode fingers or the number of the electrode fingers is not a positive integer multiple thereof.

Other features, characteristics, elements and advantages of the present invention will become apparent from the following description of preferred embodiments thereof with reference to the attached drawings.

DETAILED DESCRIPTION OF PREFERRED EMBODIMENTS

Preferred embodiments of the present invention are described with reference to the accompanying drawings.

The ripples occurring in the passbands of the surface acoustic wave filter are caused because the reflection coefficients of the interdigital transducers and the reflectors are decreased. The minimum value to which each of the reflection coefficients are decreased periodically occurs corresponding to the number of pairs of the electrode fingers and the number of the electrode fingers. Therefore, in preferred embodiments of the present invention, the number of pairs of the series arm electrode fingers and the number of the electrode fingers are set so as to have a desired relationship that prevents the individual effects thereof from combining with each other. Specifically, where the number of pairs of the electrode fingers in one of the series arm surface acoustic wave resonators that has the smallest number of the electrode fingers is determined to be 40, the number of the electrode fingers in at least one of the other surface acoustic wave resonators is determined to be a value other than n×40 (n=natural number). This is because, similar to the case where the frequency corresponding to the minimum value in a case where N=80 and $n_0$=1 corresponds with the frequency corresponding to the minimum value in a case where N=80 and $N_0$=2 according to Expression 1, generally, the frequency where the frequency corresponding to the minimum value in a case where N=40 and $n_0$=1 agrees with the frequency corresponding to the minimum value in a case where N=n×40 and $n_0$=n, whereby effects of the two strengthen each other to cause enlarged ripples. Conversely, where the number of pairs of the electrode fingers in at least one of the other surface acoustic wave resonators is set to a value other than n×40, because frequencies in which the minimum values of the reflection coefficients exist deviate from each other, effects of the two cause ripples to be suppressed by each other to cause reduced ripples. Accordingly, smoothness in the passbands in the surface acoustic wave filter is greatly increased without any reduction in propagation losses.

If three or more surface acoustic wave resonators are connected to the series arm surface acoustic wave filter, the number of pairs of the electrode fingers and the number of the electrode fingers in each of them are set so as not to be positive integer multiples of the number of pairs of the electrode fingers and the number of the electrode fingers in all of the other surface acoustic wave resonators. Thereby, the minimum values of the reflection coefficients in all of the surface acoustic wave resonators on the series arm deviate from each other, whereby the individual effects thereof cause the ripples to be suppressed by each other to allow the smoothness in the passbands in the surface acoustic wave filter to be increased further.

In addition, preferred embodiments of the present invention are effective where the number of pairs of electrode fingers in each of the series arm surface acoustic wave resonator having the smallest number of pairs of the electrode fingers is 100 or less.

Electrode capacitance is one of the parameters for determining electrical characteristics, such as the amount of attenuation and losses in the outside of the passbands of the ladder type surface acoustic wave filter. The electrode capacitance is proportional to the multiplication product of the number of pairs of the electrode fingers and the cross width thereof. Therefore, either the number of pairs of the electrode fingers or the cross width is reduced to obtain a surface acoustic wave filter with small electrode capacitance for obtaining desired electrical characteristics. However, with a reduced cross width, for example, a cross width reduced to about 5 times or less relative to the wavelength, excitation with good efficiency cannot be obtained because it is influenced by a diffraction loss and other factors. For this reason, the number of pairs of the electrode fingers must be reduced to obtain desired electrical characteristics. However, generally, reduction in the number of pairs of electrode fingers causes enlarged ripples to occur.

Figure 8:
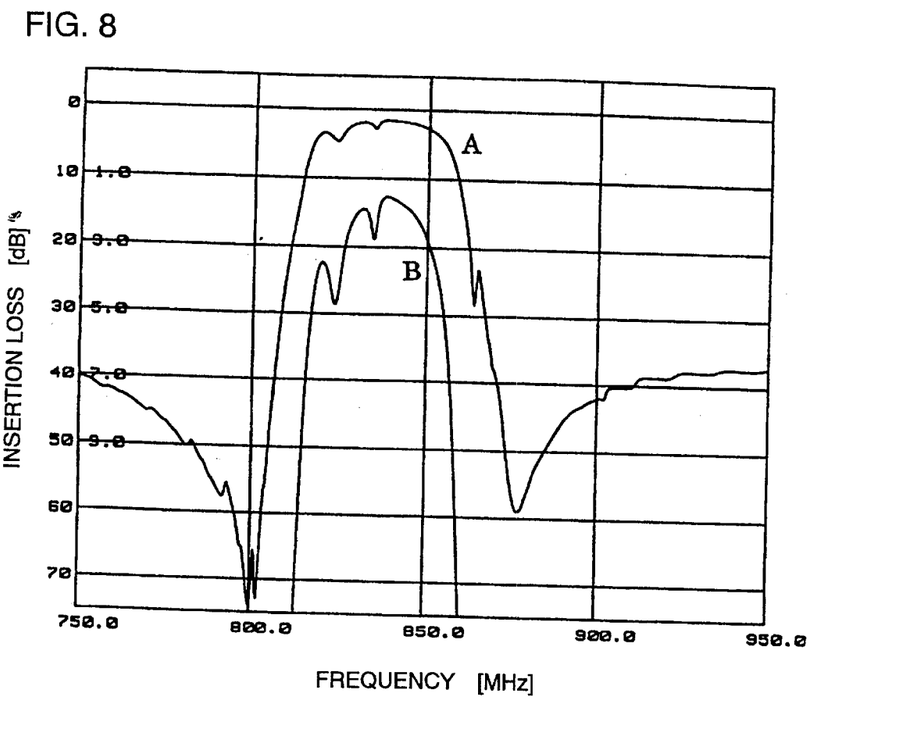
FIG. 8 is a pass-through characteristic view of a surface acoustic wave filter in a case where the number of pairs of electrode fingers is 60.
Figure 9:
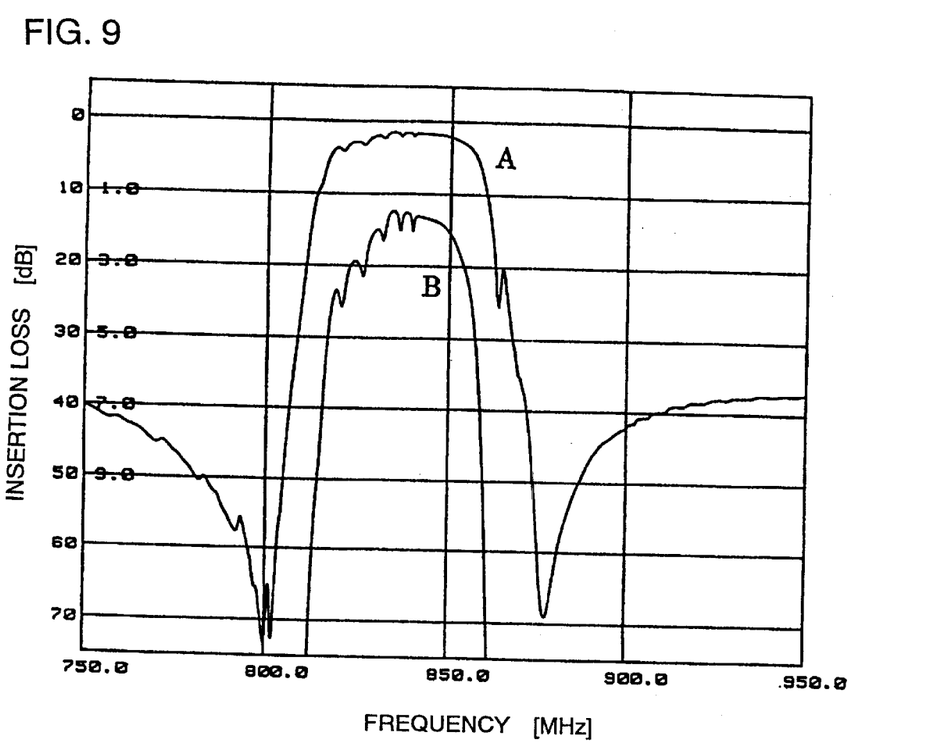
FIG. 9 is a pass-through characteristic view of a surface acoustic wave filter in a case where the number of pairs of the electrode fingers is 120.
Figure 10:
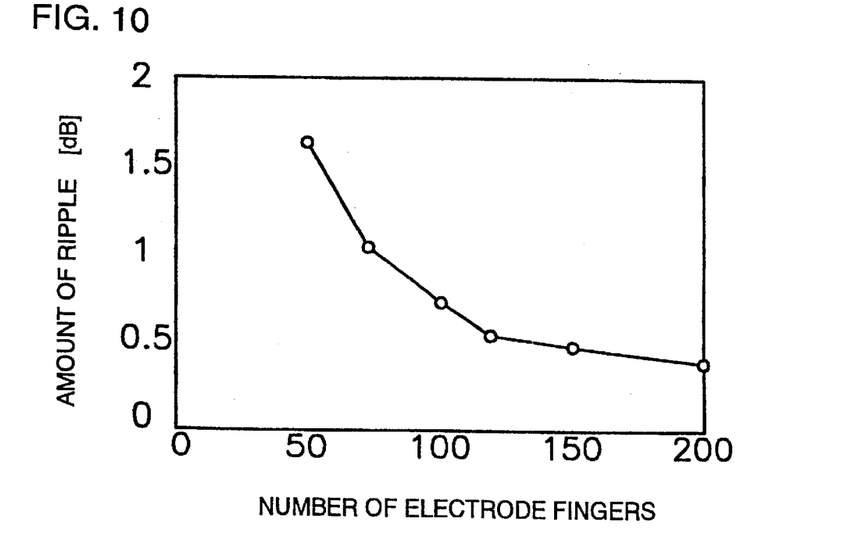
FIG. 10 shows the ripple size in relation to the numbers of pairs of the electrode fingers.

FIGS. 8 and 9 show pass-through characteristics of surface acoustic wave filters having different numbers of pairs of the electrode fingers. Configurations of the surface acoustic wave filters are similar to that shown in FIG. 1. FIG. 8 shows pass-through characteristics where the number of pairs of the electrode fingers in each of the surface acoustic wave resonators is 60. FIG. 9 shows pass-through characteristics where the number of pairs of the electrode fingers in each of the surface acoustic wave resonators is 120. In addition, FIG. 10 is a graph showing the relationship between the ripple size and the number of pairs of the electrode fingers at a cut angle of about 38 degrees. As will be apparent from comparison between FIG. 8 and FIG. 9, the smaller the number of pairs of the electrode fingers, the larger the size of ripples existing in passbands. This is also apparent from the graph in FIG. 10.

As has already been described above, the smoothness in the passbands is required to be increased for the characteristics of surface acoustic wave filters. Specifically, the smoothness in the passbands is required to be about 0.7 dB or less. As can be seen from FIG. 10, according to the surface acoustic wave filter having the conventional configuration, in a case where the number of pairs of the electrode fingers in the series arm surface acoustic wave resonator is 100 or less, the ripple size exceeds 0.7 dB. That is, it is very difficult to satisfy the present commercial needs with the conventional configuration. Further, as described above, to obtain desired electrical characteristics, the number of pairs of the electrode fingers must be reduced.

According to the surface acoustic wave filter of preferred embodiments of the present invention, adverse effects of the series arm surface acoustic wave resonators cause ripples to be suppressed by each other. Therefore, even where the number of pairs of the electrode fingers is 100 or less, the surface acoustic wave filter having desired electrical characteristics and desired smoothness in the passbands is obtained. This feature is especially advantageous in the case where the cut angle is approximately 30 degrees or more. Even where the number of pairs of the electrode fingers is 100 or less, the ripples are successfully suppressed to produce a filter having ideal filter characteristics.

The surface acoustic wave filter of preferred embodiments of the present invention can be successfully applied to a duplexer. Typically, such a duplexer includes at least two of the filters described above, input/output-connections individually connected to the aforementioned filters, and an antenna-connection commonly connected to the aforementioned filters.

Furthermore, the surface acoustic wave filter of preferred embodiments of the present invention may be incorporated into a communication apparatus including the duplexer described above, a transmitting circuit connected to at least one of the input/output-connections of the aforementioned duplexer, a receiving circuit connected to at least one of the input/output-connections that differs from the aforementioned input/output-connection connected to the aforementioned transmitting circuit, and an antenna connected to the antenna-connection of the aforementioned duplexer.

According to the above, the duplexer and the communication apparatus that meet the characteristics requirements is obtained.

A description will be provided of specific preferred embodiments of a surface acoustic wave filter according to the present invention.

Figure 11:
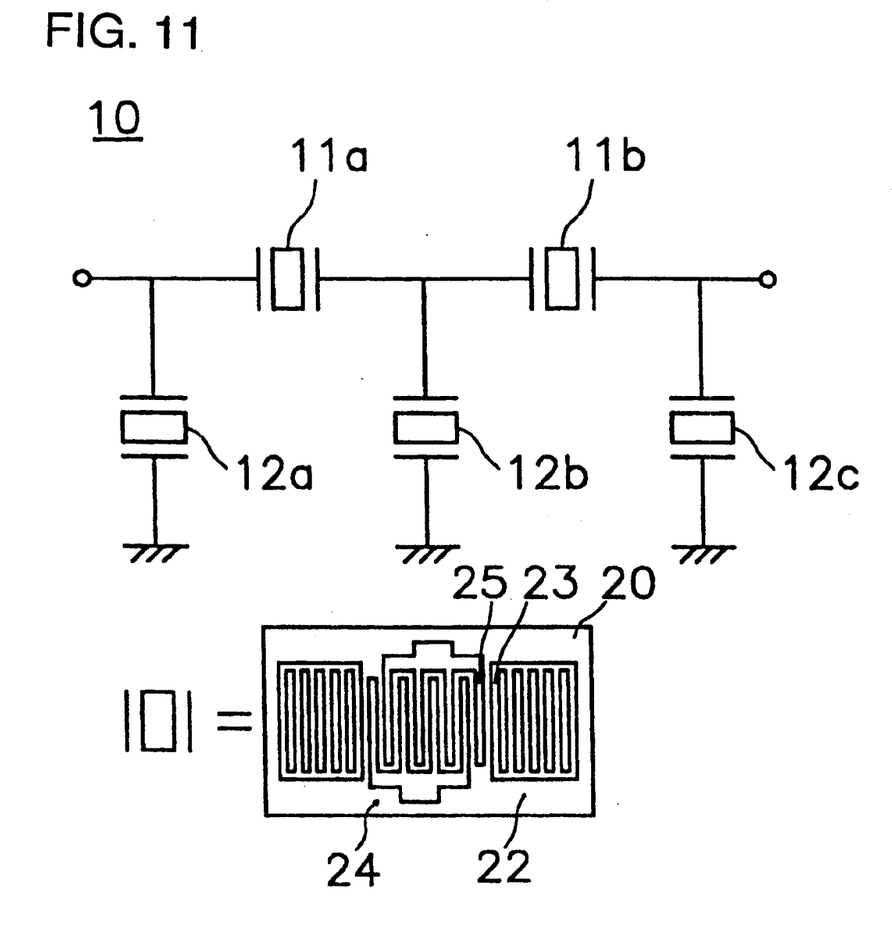
FIG. 11 shows a configuration of a surface acoustic wave filter according to a first preferred embodiment of the present invention.

FIG. 11 shows a configuration of a surface acoustic wave filter 10 according to a first preferred embodiment of the present invention. In the first preferred embodiment, two series arm surface acoustic wave resonators 11a and 11b, and three parallel arm surface acoustic wave resonator filters 12a, 12b, and 12c each having reflectors 22 are made of aluminum electrodes on a 42-degree Y-cut X-propagation-LiTaO$_3$ substrate 20. In the series arm surface acoustic wave resonators 11a and 11b, the wavelength defined by an inter-electrode-finger pitch is about 4.66 μm the cross width defined thereby is about 50 μm and no reflector is provided. The number of pairs of the electrode fingers is 68 in the series arm surface acoustic wave resonator 11a and is 82 in the series arm surface acoustic wave resonator 11b. In the parallel arm surface acoustic wave resonators 12a, 12b, and 12c, the wavelength defined by an inter-electrode-finger pitch is about 4.86 μm and the cross width defined thereby in the parallel arm surface acoustic wave resonators 12a and 12c is about 1.20 μm and is about 240 μm in the parallel arm surface acoustic wave resonator 12b, and the number of electrode fingers is 160. The number of pairs of the electrode fingers in each of them is 80.

Figure 12:
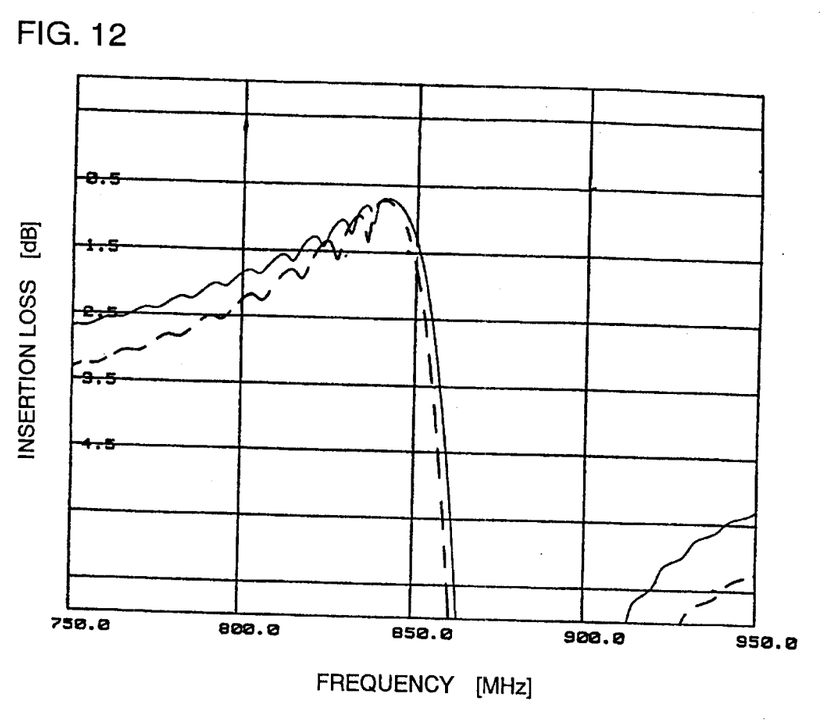
FIG. 12 shows transmission characteristics in a case where surface acoustic wave resonators that are used in the first preferred embodiment of the present invention are series-connected.

FIG. 12 shows transmission characteristics of a configuration in which the surface acoustic wave resonators 11a and 11b used for the series arms are series-connected as shown in FIG. 11. In the characteristic view in FIG. 12, a graph where the surface acoustic wave resonator 11a is series-connected is indicated by a dotted line, and a graph where the surface acoustic wave resonator 11b is series-connected is shown by a solid line. It can be seen in FIG. 12 that frequency positions of ripples caused by the surface acoustic wave resonator 11a deviate from those caused by the surface acoustic wave resonator 11b.

Figure 13:
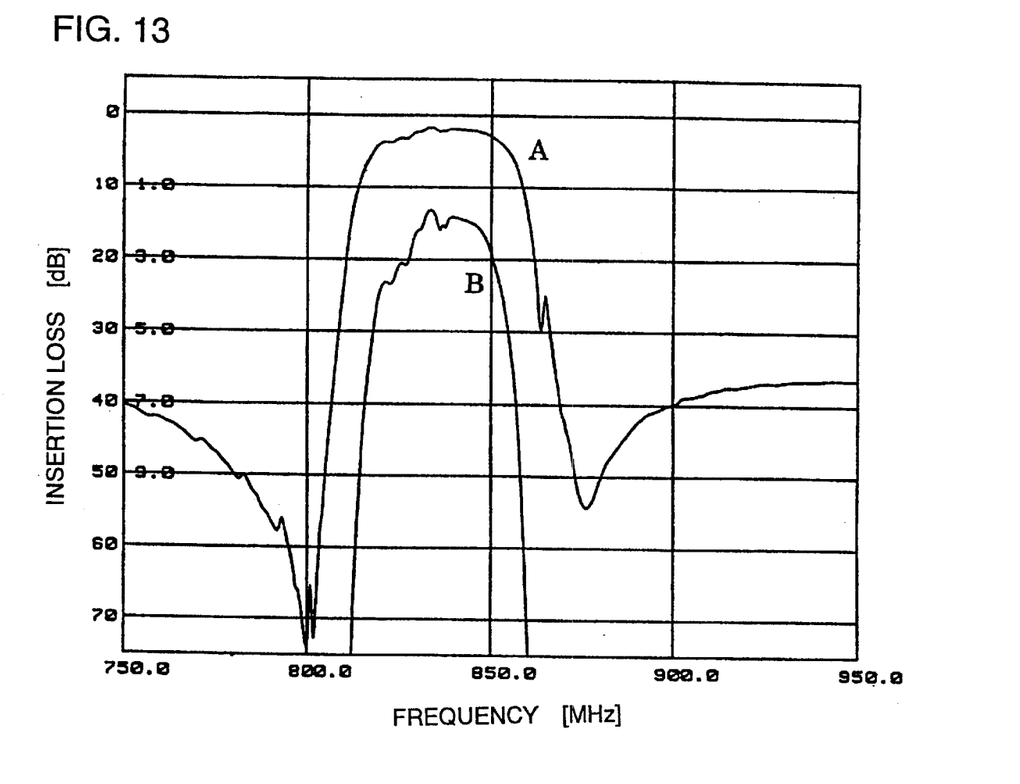
FIG. 13 is a pass-through characteristic view of the surface acoustic wave filter according to the first preferred embodiment of the present invention.
Figure 14:
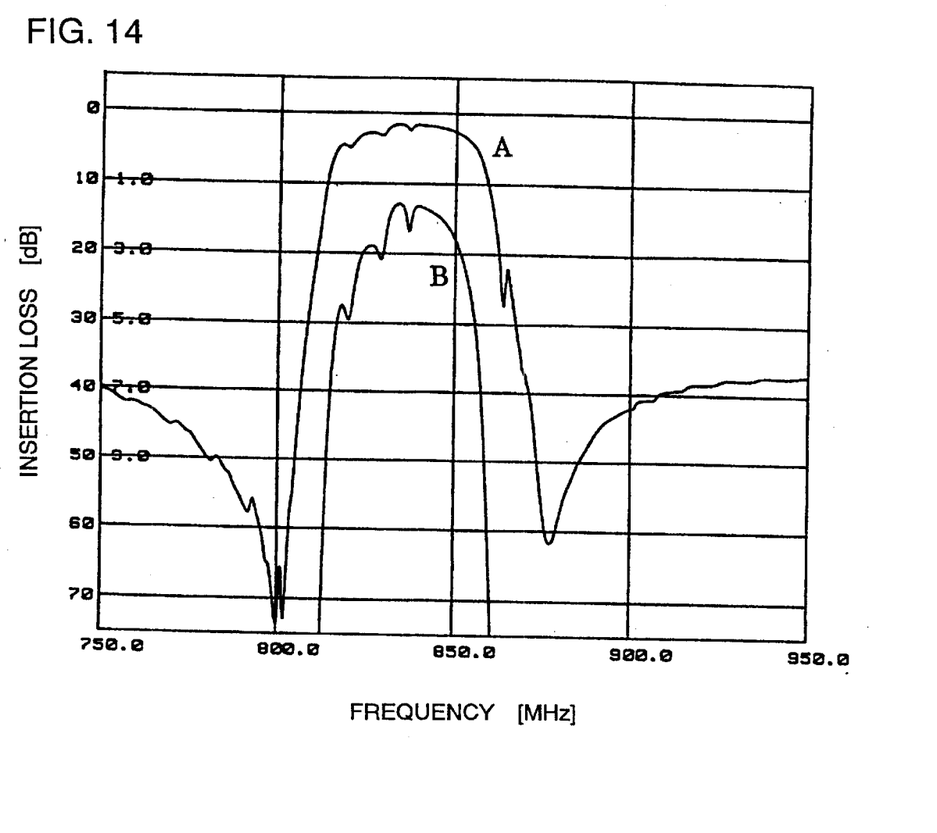
FIG. 14 is a pass-through characteristic view of a comparison example of a surface acoustic wave filter.

FIG. 13 shows pass-through characteristics of the surface acoustic wave filter, and, as an example of comparison therewith, FIG. 14 shows pass-through characteristics of a configuration in which the conditions are the same, except that the number of pairs of the electrode fingers in each of the series arm surface acoustic wave resonators 11a and 11b is changed to 75. As can be seen from FIGS. 13 and 14, ripples of 1 dB or more occur in the case shown in the comparison example in which the numbers of pairs of the electrode fingers in the series arm surface acoustic wave resonators are the same. However, ripples are reduced to about 0.05 dB in passbands of the surface acoustic wave filter having the configuration according to preferred embodiments of the present invention. This indicates that, in the surface acoustic wave filter having the configuration according to preferred embodiments of the present invention, ripples caused by the series arm surface acoustic wave resonators are suppressed by each other.

Figure 15:
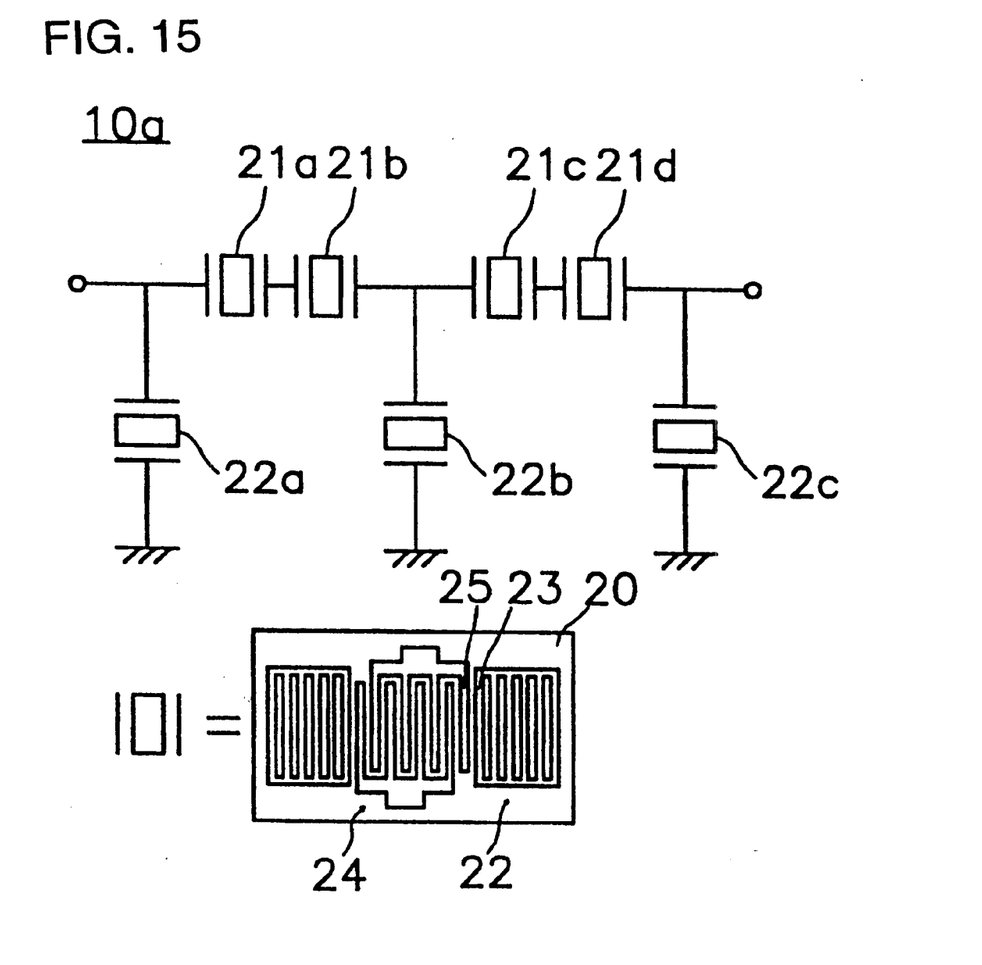
FIG. 15 shows a configuration of a surface acoustic wave filter according to a second preferred embodiment of the present invention.

FIG. 15 shows a configuration of a surface acoustic wave filter 10a according to a second preferred embodiment of the present invention. In the second preferred embodiment, four series arm surface acoustic wave resonators 21a, 21b, 21c, and 21d, and three parallel arm surface acoustic wave resonator filters 22a, 22b, and 22c each having reflectors 22 are made of aluminum electrodes on a 42-degree Y-cut X-propagation-LiTaO$_3$ substrate 20. In the series arm surface acoustic wave resonators 21a, 21b, 21c, and 21d, the wavelength defined by an inter-electrode-finger pitch is about 4.66 μm the cross width defined thereby is about 95 μm and no reflector is provided. The number of pairs of the electrode fingers is 55 in the series arm surface acoustic wave resonator 21a, is 95 in the surface acoustic wave resonator 21b, is 80 in the surface acoustic wave resonator 21c, and is 70 in the series arm surface acoustic wave resonator 21d. In the parallel arm surface acoustic wave resonators 22a, 22b, and 22c, the wavelength defined by an inter-electrode-finger pitch is about 4.86 μm the cross width defined thereby in the parallel arm surface acoustic wave resonators 22a and 22c is about 120 μm and is about 240 μm in the parallel arm surface acoustic wave resonator 22b, and the number of electrode fingers is 160. The number of pairs of the electrode fingers therein is 80.

Figure 16:
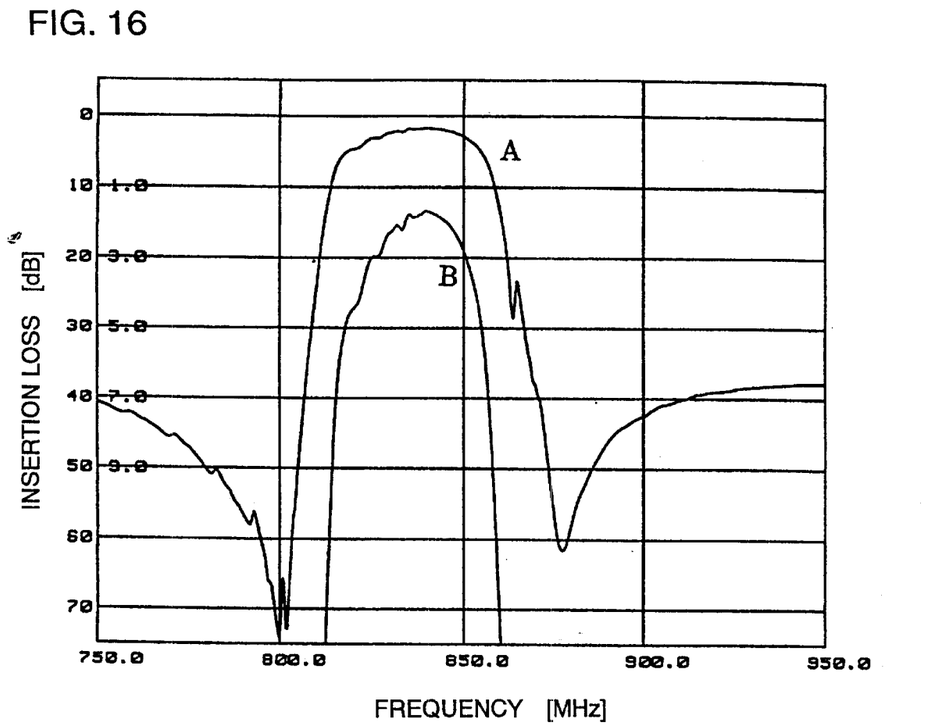
FIG. 16 is a pass-through characteristic view of the surface acoustic wave filter according to the second preferred embodiment of the present invention.

FIG. 16 shows pass-through characteristics of the surface acoustic wave filter having the above-described configuration. In the present preferred embodiment, the number of the electrode fingers in each of the four series arm surface acoustic wave resonators is arranged not to be an integer multiple of that in each of the other surface acoustic wave resonators. This establishes the relationship where ripples caused by each of the series arm surface acoustic wave resonators are suppressed by each other. Therefore, as can be seen from comparison between FIG. 13 showing the passing-characteristics of the first preferred embodiment and FIG. 16 showing the passing-through characteristics of the second preferred embodiment, smoothness in characteristics of the present embodiment is additionally increased.

Figure 17:
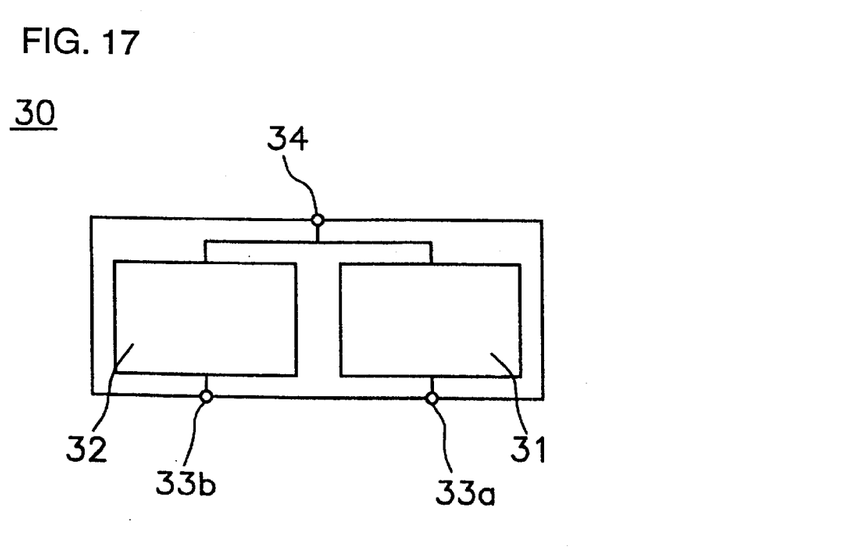
FIG. 17 is a schematic view of a duplexer according to a preferred embodiment of the present invention.

Hereinbelow, referring to FIG. 17, a description will be provided of a duplexer according to another preferred embodiment of the present invention. FIG. 17 is a schematic view of a duplexer according to the present preferred embodiment.

As shown in FIG. 17, a duplexer 30 according to the preferred embodiment includes a transmitting filter 31 and a receiving filter 32, and input/output-connecting terminals 33a and 33b located, respectively, on the input side of the transmitting filter 31 and the output side of the receiving filter 32. The output side of the transmitting filter 31 and the input side of the receiving filter 32 are integrally connected to an antenna-connecting terminal 34. The transmitting filter 31 and the receiving filter 32 in the duplexer 30 are arranged and constructed in accordance with the above-described preferred embodiments. Only signals in a predetermined frequency band are allowed to pass in the transmitting filter 31, and signals in a frequency band different from that predetermined for the transmitting filter 31 are allowed to pass in the receiving filter 32.

Figure 18:
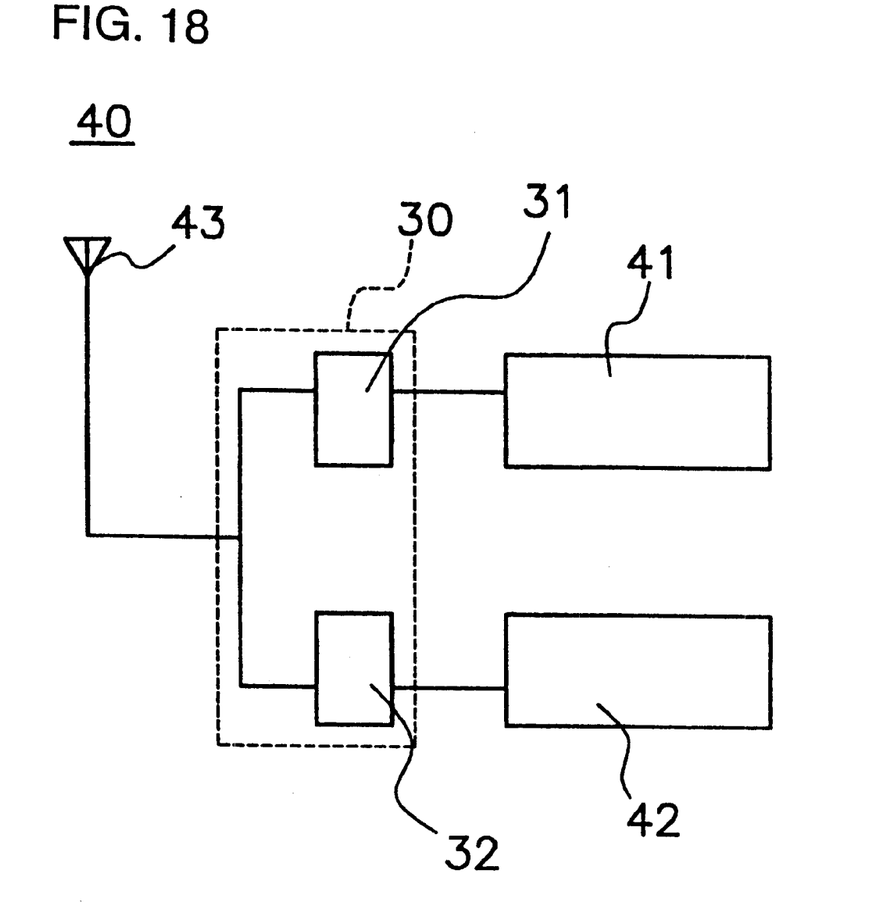
FIG. 18 is a schematic view of a communication apparatus of a preferred embodiment of the present invention.

In addition, referring to FIG. 18, a description will be given of a communication apparatus according to a preferred embodiment of the present invention. FIG. 18 is a schematic view of a communication apparatus of this preferred embodiment.

As shown in FIG. 18, a communication apparatus 40 includes the duplexer 30, a transmitting filter 41, a receiving filter 42, and an antenna 43. The duplexer 30 is described in the above preferred embodiment, in which the input/output-connecting terminal 32*a* connected to the transmitting filter 31 in FIG. 17 is connected to the transmitting filter 41, and the input/output-connecting terminal 33*b* connected to the receiving filter 32 in FIG. 17 is connected to the receiving filter 42. Also, the antenna-connecting terminal 34 is connected to the antenna 43.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A surface acoustic wave filter comprising:
    a Y-cut X-propagation LiTaO$_3$ substrate having a cut angle of about 38 degrees to about 46 degrees;
    at least first and second series arm surface acoustic wave resonators provided on the substrate and connected in series to define a series arm; and
    at least one parallel arm surface acoustic wave resonator provided on the substrate and connected to the series arm;
        wherein each of the first and second series arm surface acoustic wave resonator includes an interdigital transducer having a plurality of pairs of electrode fingers, and a number of pairs of the electrode fingers of the first series arm surface acoustic wave resonator is represented by N (N=a natural number), the corresponding number of the second series arm surface acoustic wave resonator differs from n×N (n=a natural number),such that the size of ripples in pass band is reduced.

2. A surface acoustic wave filter according to claim 1, wherein the surface acoustic wave filter includes a plurality of series arm surface acoustic wave resonators connected in series, each of the series arm surface acoustic wave resonators has an interdigital transducer having a plurality of pairs of electrode fingers, and where the numbers of pairs of the electrode fingers of the plurality of series arm surface acoustic wave resonators are respectively represented by $N_1$, $N_2, \ldots N_m$ ($N_1, N_2, \ldots N_m$=natural numbers), the number $N_k$ (k=1 to m) thereof differs from n×$N_h$ (n=natural number; h=1 to m; but k and h differ from each other) for all k and h.

3. The surface acoustic wave filter according to claim 2, wherein the smallest number of pairs of the electrode fingers in the aforementioned surface acoustic wave resonators on the series arm is 100 or less.

4. The surface acoustic wave filter according to claim 1, wherein the smallest number of pairs of the electrode fingers in the aforementioned surface acoustic wave resonators on the series arm is 100 or less.

5. A surface acoustic wave filter comprising:
    a Y-cut X-propagation LiTaO$_3$ substrate having a cut angle of about 38 degrees to about 46 degrees;
    at least first and second series arm surface acoustic wave resonators provided on the substrate and connected in series to form a series arm; and
    at least one parallel arm surface acoustic wave resonator provided on the substrate and connected to the series arm,
        wherein each of the first and second series arm surface acoustic wave resonator includes an interdigital transducer and a pair of reflectors having a plurality of pairs of electrode fingers, and a number of pairs of the electrode fingers of the interdigital transducer of the first series arm surface acoustic wave resonator is represented by N (N=natural number), the corresponding number of pairs of the electrode fingers of the interdigital transducer of the second series arm surface acoustic wave resonator differs from n×N (n=natural number, such that the size of ripples in the pass band is reduced .

6. A surface acoustic wave filter according to claim 5, wherein the surface acoustic wave filter includes a plurality of series arm surface acoustic wave resonators connected in series, each of the series arm surface acoustic wave resonators has an interdigital transducer and a pair of reflectors having a plurality of pairs of electrode fingers, and Where the numbers of pairs of the electrode fingers of the interdigital transducers of the plurality of series arm surface acoustic wave resonators are respectively represented by $N_1$, $N_2, \ldots N_m$ ($N_1, N_2, \ldots N_m$=natural numbers), the number $N_k$ (k=1 to m) thereof differs from n×$N_h$ (n=natural number; h=1 to m; but k and h differ from each other) for all k and h.

7. A duplexer comprising:
    at least two filters, at least one of at least two filter including:
        a Y-cut X-propagation LiTaO$_3$ substrate having a cut angle of about 38 degrees to about 46 degrees;
        at least first and second series arm surface acoustic wave resonators provided on the substrate and connected in series to define a series arm; and
        at least one parallel arm surface acoustic wave resonator provided on the substrate and connected to the series arm;
            wherein each of the first and second series arm surface acoustic wave resonator includes an interdigital transducer having a plurality of pairs of electrode fingers, and a number of pairs of the electrode fingers of the first series arm surface acoustic wave resonator is represented by N (N=a natural number), the corresponding number of the second series arm surface acoustic wave resonator differs from n×N (n=a natural number), such that the size of ripples in the pass band is reduce;
    input/output-connection terminals individually connected to the at least two filters; and
    an antenna-connection terminal commonly connected to the at least two filters.

8. A duplexer according to claim 7, wherein the surface acoustic wave filter includes a plurality of series arm surface acoustic wave resonators connected in series, each of the series arm surface acoustic wave resonators has an interdigital transducer having a plurality of pairs of electrode fingers, and where the numbers of pairs of the electrode fingers of the plurality of series arm surface acoustic wave resonators are respectively represented by $N_1, N_2, \ldots N_m$ ($N_1, N_2, \ldots N_m$=natural numbers), the number $N_k$ (k=1 to m) thereof differs from n×$N_h$ (n=natural number; h=1 to m; but k and h differ from each other) for all k and h.

9. A duplexer according to claim 8, wherein the smallest number of pairs of the electrode fingers in the aforementioned surface acoustic wave resonators on the series arm is 100 or less.

10. duplexer according to claim 7, wherein the smallest numberof pairs of the electrode fingers in the aforementioned surface acoustic wave resonators on the series arm is 100 or less.

11. A duplexer according to claim 7, wherein the surface acoustic wave filter includes a plurality of series arm surface acoustic wave resonators connected in series, each of the series arm surface acoustic wave resonators has an interdigital transducer and a pair of reflectors having a plurality of pairs of electrode fingers, and where the numbers of pairs of the electrode fingers of the interdigital transducers of the plurality of series arm surface acoustic wave resonators are respectively represented by $N_1, N_2, \ldots N_m$ ($N_1, N_2, \ldots N_m$=natural numbers), the number $N_k$ (k=1 to m) thereof differs from n×x $N_h$ (n=natural number; h=1 to m; but k and h differ from each other) for all k and h.

12. A communication apparatus comprising:
  a duplexer including at least two filters, at least one of at least two filter including:
    a Y-cut X-propagation $LiTaO_3$ substrate having a cut angle of about 38 degrees to about 46 degrees;
    at least first and second series arm surface acoustic wave resonators provided on the substrate and connected in series to define a series arm; and
    at least one parallel arm surface acoustic wave resonator provided on the substrate and connected to the series arm;
      wherein each of the first and second series arm surface acoustic wave resonator includes an interdigital transducer having a plurality of pairs of electrode fingers, and a number of pairs of the electrode fingers of the first series arm surface acoustic wave resonator is represented by N (N=a natural number), the corresponding number of the second series arm surface acoustic wave resonator differs from n×N (n=a natural number), such that the size of ripples in the pass band is reduced ;
    input/output-connection terminals individually connected to the at least two filters; and
    an antenna-connection terminal commonly connected to the at least two filters;
  a transmitting circuit connected to at least one of the input/output-connection terminals of the duplexer;
  a receiving circuit connected to at least one of the input/output-connection terminals that differs from the input/output-connection terminal connected to the transmitting circuit; and
  an antenna connected to the antenna-connection terminal of the duplexer.

13. A communication apparatus according to claim 12, wherein the surface acoustic wave filter includes a plurality of series arm surface acoustic wave resonators connected in series, each of the series arm surface acoustic wave resonators has an interdigital transducer having a plurality of pairs of electrode fingers, and where the numbers of pairs of the electrode fingers of the plurality of series arm surface acoustic wave resonators are respectively represented by $N_1, N_2, \ldots N_m$ ($N_1, N_2, \ldots N_m$=natural numbers), the number $N_k$ (k=1 to m) thereof differs from n×$N_h$ (n=natural number; h=1 to m; but k and h differ from each other) for all k and h.

14. A communication apparatus according to claim 13, wherein the smallest number of pairs of the electrode fingers in the aforementioned surface acoustic wave resonators on the series arm is 100 or less.

15. A communication apparatus according to claim 12, wherein the smallest number of pairs of the electrode fingers in the aforementioned surface acoustic wave resonators on the series arm is 100 or less.

16. A communication apparatus according to claim 12, wherein the surface acoustic wave filter includes a plurality of series arm surface acoustic wave resonators connected in series, each of the series arm surface acoustic wave resonators has an interdigital transducer and a pair of reflectors having a plurality of pairs of electrode fingers, and where the numbers of pairs of the electrode fingers of the interdigital transducers of the plurality of series arm surface acoustic wave resonators are respectively represented by $N_1, N_2, \ldots N_m$ ($N_1, N_2, \ldots N_m$=natural numbers), the number $N_k$ (k=1 to m) thereof differs from n×$N_h$ (n=natural number; h=1 to m; but k and h differ from each other) for all k and h.

* * * * *